United States Patent
Nakayama et al.

(10) Patent No.: US 9,448,495 B2
(45) Date of Patent: Sep. 20, 2016

(54) RESIST PATTERN CALCULATION METHOD AND CALCULATION PROGRAM STORAGE MEDIUM

(75) Inventors: Ryo Nakayama, Utsunomiya (JP); Kouichirou Tsujita, Utsunomiya (JP); Koji Mikami, Nikko (JP); Hiroyuki Ishii, Shioya-gun (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 1101 days.

(21) Appl. No.: 13/233,209

(22) Filed: Sep. 15, 2011

(65) Prior Publication Data

US 2012/0092639 A1    Apr. 19, 2012

(30) Foreign Application Priority Data

Oct. 19, 2010  (JP) ................................ 2010-234914

(51) Int. Cl.
G03B 27/32 (2006.01)
G03F 7/20 (2006.01)

(52) U.S. Cl.
CPC ........... *G03F 7/705* (2013.01); *G03F 7/70558* (2013.01); *G03F 7/70608* (2013.01)

(58) Field of Classification Search
CPC ............... G03F 7/70491; G03F 7/705; G03F 7/70541; G03F 7/70558; G03F 7/70608; G03F 7/70625
USPC ...................... 355/52, 53, 55, 67–71, 72–77; 250/492.1, 492.2, 492.22, 548; 716/51; 430/5, 8, 22, 30
See application file for complete search history.

(56) References Cited

U.S. PATENT DOCUMENTS 5,955,227 A * 9/1999 Tsujita et al. .................... 430/30
6,014,456 A * 1/2000 Tsudaka ......................... 382/144
(Continued)

FOREIGN PATENT DOCUMENTS

JP    8-148404 A    6/1996

OTHER PUBLICATIONS

KLA-Tencor "http://www.kla-tencor.com/Lithography-Software/chip-prolith.html", KLA-Tencor Corporation, printed Sep. 30, 2015.

*Primary Examiner* — Christina Riddle
(74) *Attorney, Agent, or Firm* — Rossi, Kimms & McDowell LLP

(57) ABSTRACT

A recording medium stores a program for causing a computer to execute a method of calculating a resist pattern. The method includes: a first step of calculating a light intensity distribution of an optical image formed on the resist, based on the reticle pattern and an exposure condition; a second step of convoluting, using a first diffusion length, the calculated light intensity distribution; a third step of calculating a representative light intensity from the calculated light intensity distribution or the convoluted light intensity distribution; a fourth step of correcting the convoluted light intensity distribution by adding, to the convoluted light intensity distribution, a correction function including a first function given by:

$$\left\{\sum_{k=0}^{n}(a_k J^k)\right\}\exp(-\alpha J)$$

where J is the distribution of the representative light intensity; and a fifth step of calculating the resist pattern based on the corrected light intensity distribution and a slice level set in advance.

7 Claims, 17 Drawing Sheets

(56) References Cited

U.S. PATENT DOCUMENTS

2002/0161527 A1* 10/2002 Inui ................................ 702/22
2006/0208205 A1* 9/2006 Chen et al. .............. 250/492.22
2009/0233194 A1* 9/2009 Yoshii et al. ................... 430/30

* cited by examiner

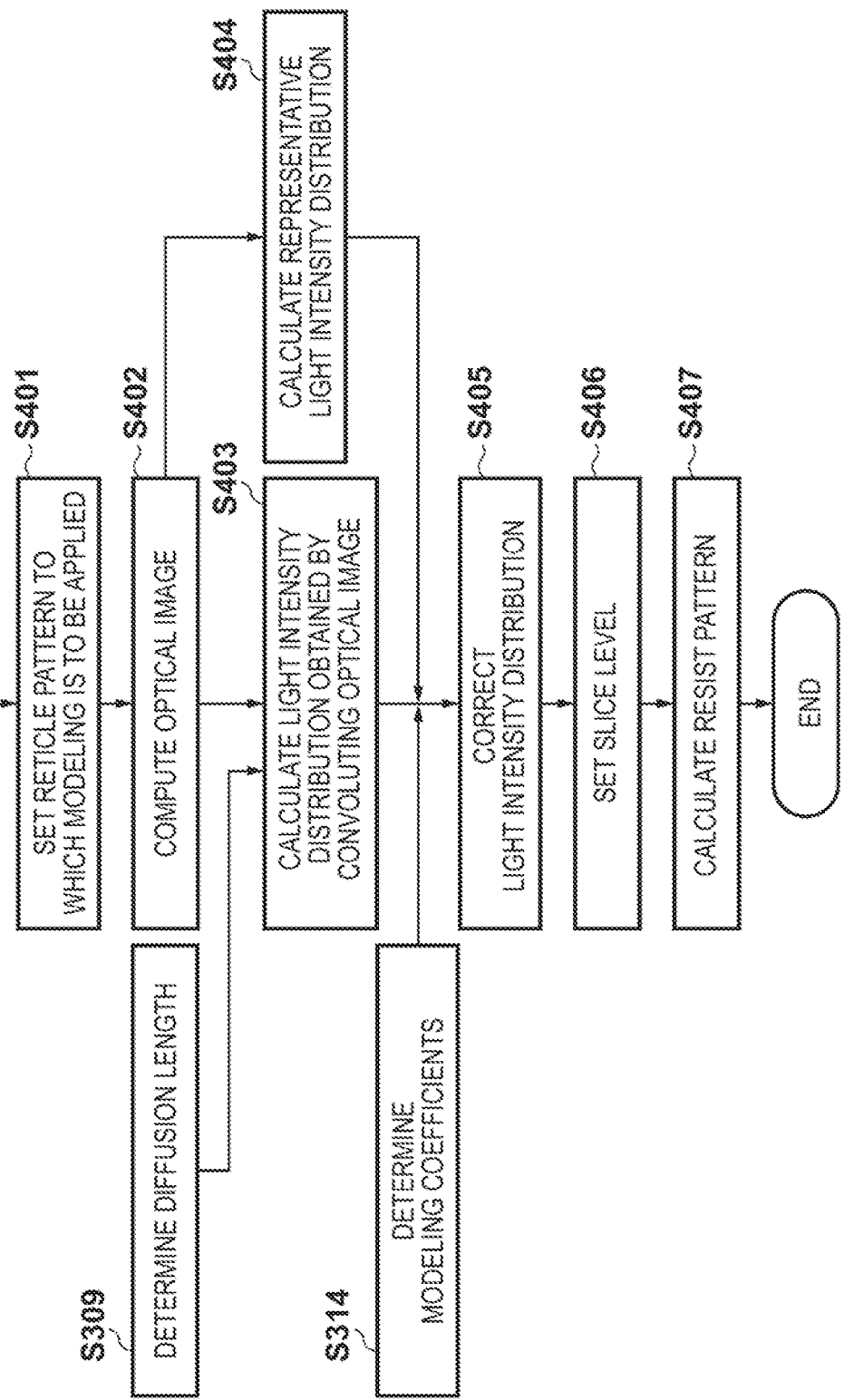

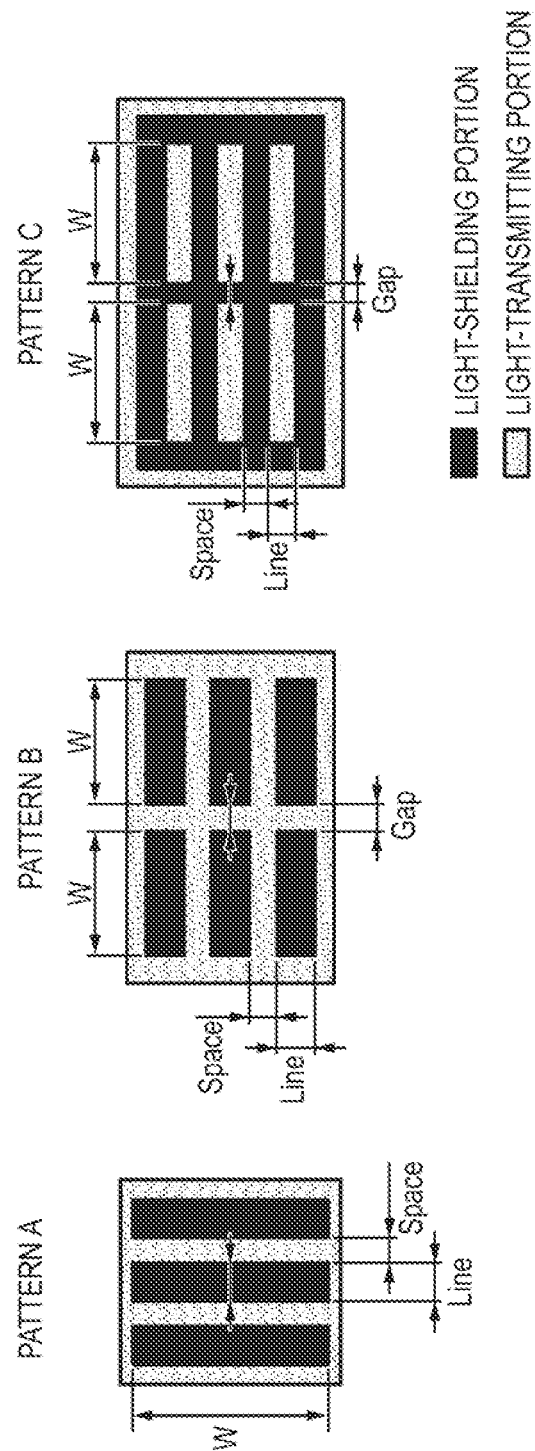

F I G. 16
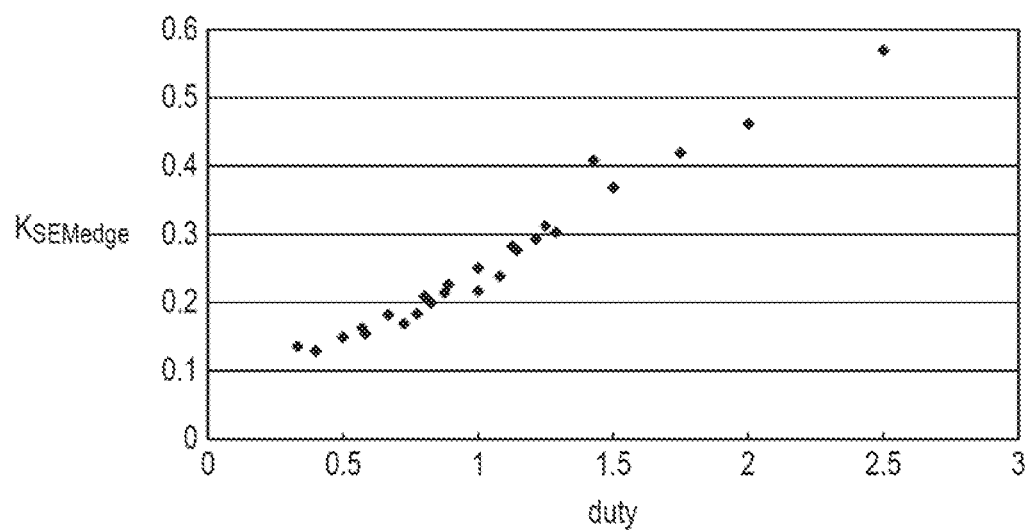

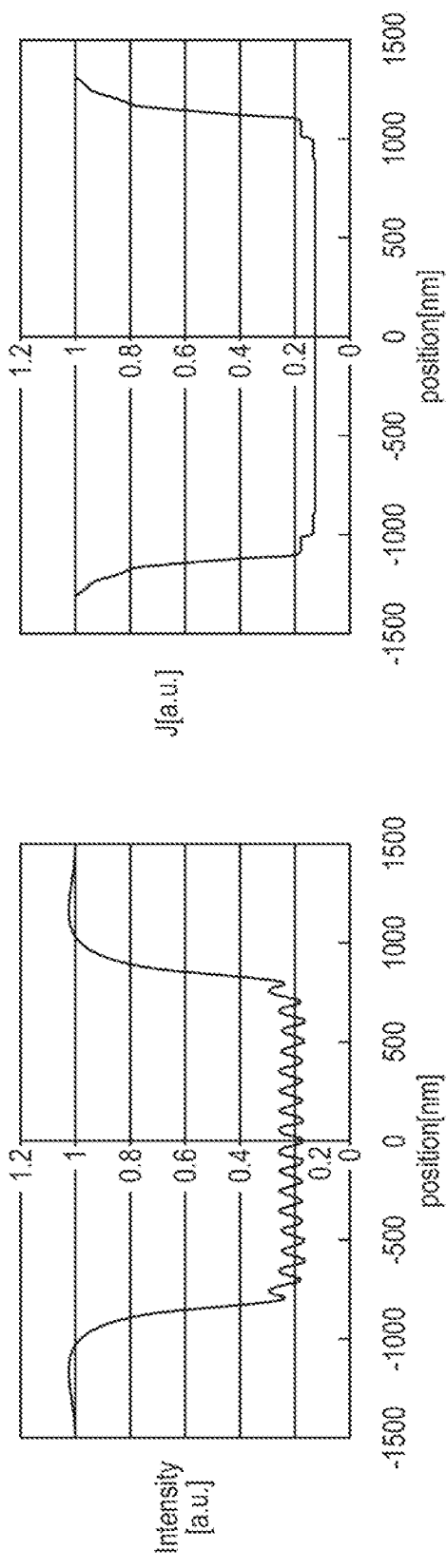
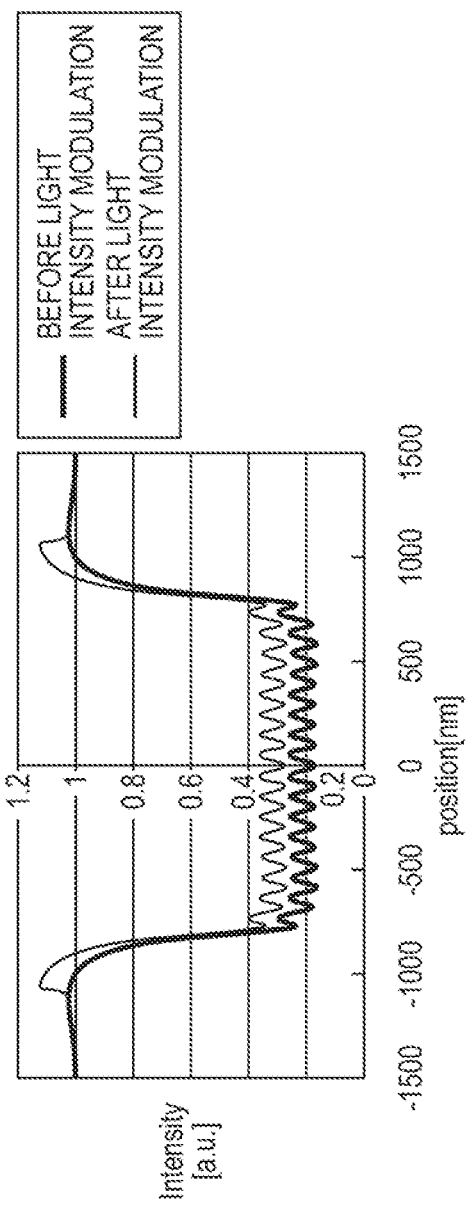
FIG. 17A
FIG. 17B
FIG. 17C

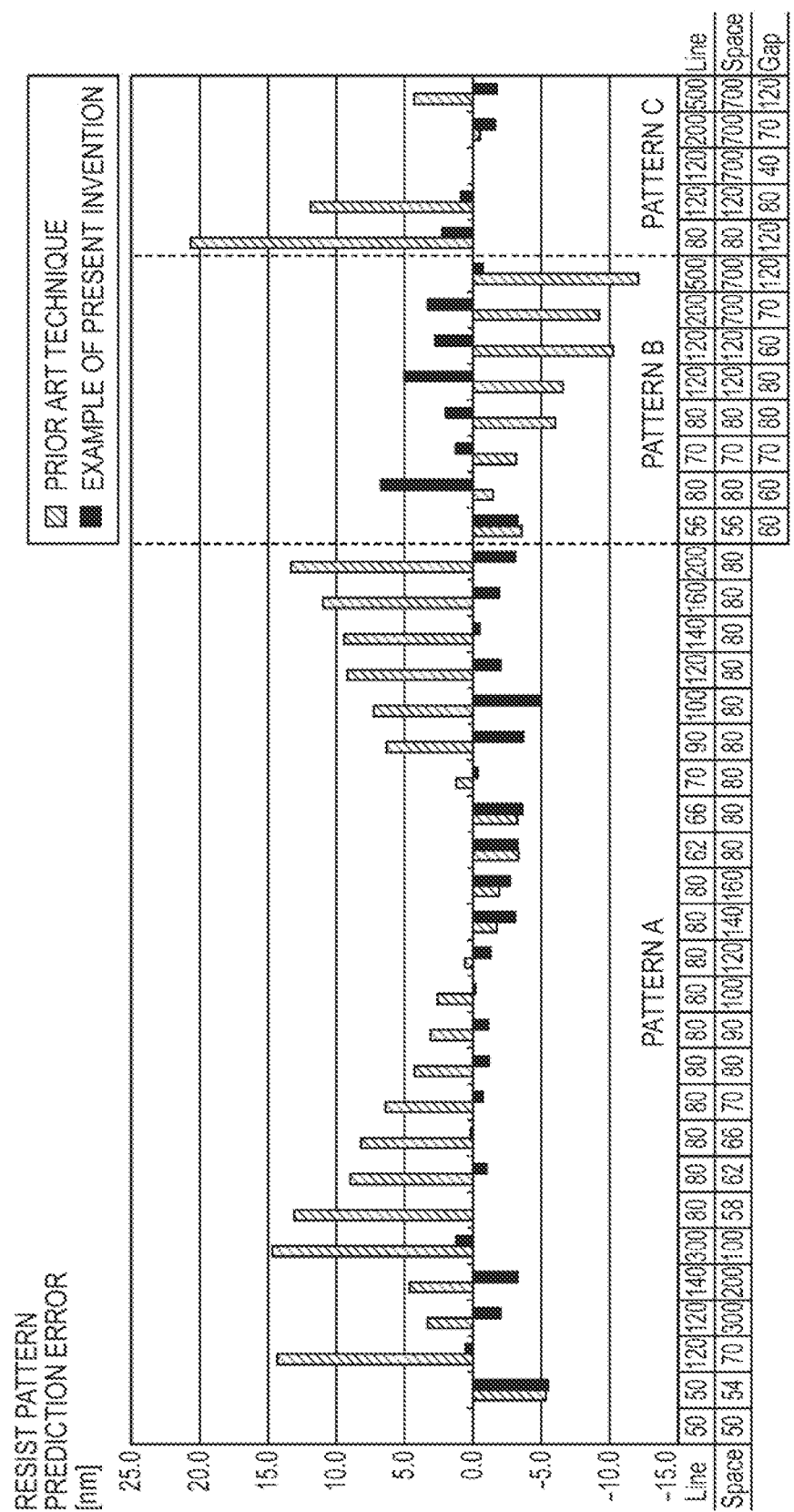
F I G. 18

RESIST PATTERN CALCULATION METHOD AND CALCULATION PROGRAM STORAGE MEDIUM

BACKGROUND OF THE INVENTION

1. Field of the Invention

The present invention relates to a resist pattern calculation method and a calculation program storage medium.

2. Description of the Related Art

In a lithography process, a resist pattern is formed by an exposure process in which light from a reticle pattern is projected onto a resist by a projection optical system to expose the resist to light, and a development process in which the exposed resist is developed. A resist pattern having a desired shape is desirably transferred and formed on the wafer. However, due to, for example, the optical proximity effect (OPE) and low k1, a resist pattern having a desired shape cannot be transferred onto the wafer in practice. This is one factor which deteriorates the device characteristics. Therefore, to improve the device characteristics, it is necessary to calculate the shape of a resist pattern.

To calculate a resist pattern, Japanese Patent Laid-Open No. 08-148404 discloses a method of calculating a resist pattern from a light intensity distribution obtained by convoluting a light intensity distribution computed based on an optical image. In the technique described in Japanese Patent Laid-Open No. 08-148404, the light intensity distribution of the optical image is convoluted using various variance values (to be referred to as diffusion lengths hereinafter) to obtain a diffusion length close to that obtained in the exposure result. In the technique described in Japanese Patent Laid-Open No. 08-148404, a diffusion length obtained in the modeling result is then applied to calculation of the convolution integral of the light intensity distribution of a pattern to be calculated, thereby calculating the size of a resist pattern.

Unfortunately, it is difficult for the prior art technique described in Japanese Patent Laid-Open No. 08-148404 to calculate the size of a resist pattern with high accuracy. The inventor of the present invention examined the cause of this difficulty, and concluded that with the current tendency toward low k1, a method of mathematically convoluting a light intensity distribution computed based on an optical image cannot represent the diffusion phenomenon of an acid in a resist with sufficiently high precision. This is for the following reason. FIG. 1 is a schematic view of a chemical reaction produced during exposure in a chemically amplified resist. During exposure, in a region with a high light intensity (bright region), an acid ($H^-$) in the resist sequentially undergoes a chain reaction with a resist polymer. In contrast to this, in a region with a low light intensity (dark region), the acid ($H^+$) is neutralized with a base ($OH^-$) contained in a quencher. That is, the behavior of the acid differs depending on the magnitude of the intensity of exposure light (whether the region of interest is bright or dark). The prior art technique described in Japanese Patent Laid-Open No. 08-148404, in which the optical image is convoluted in the same mathematical form regardless of the magnitude of the light intensity, does not take into consideration the above-mentioned behavior of the acid.

SUMMARY OF THE INVENTION

The present invention has been made in consideration of the above-mentioned situation, and provides a technique of improving the calculation accuracy of a resist pattern.

The present invention in its one aspect provides a recording medium storing a program for causing a computer to execute a method of calculating a resist pattern formed on a substrate by exposing the resist to light via a pattern of a reticle and a projection optical system, and developing the exposed resist, the method including: a first step of calculating a light intensity distribution of an optical image formed on the resist, based on the pattern of the reticle and an exposure condition; a second step of convoluting, using a first diffusion length, the light intensity distribution calculated in the first step; a third step of calculating a representative light intensity for a point, that is representative of light intensities in a region which has a predetermined size and includes the point defined within a plane of the resist, using the light intensity distribution calculated in the first step or the light intensity distribution convoluted in the second step; a fourth step of correcting the light intensity distribution convoluted in the second step by adding, to the light intensity distribution convoluted in the second step, a correction function including a first function given by:

$$\left\{ \sum_{k=0}^{n} (a_k J^k) \right\} \exp(-\alpha J)$$

where J is the distribution of the representative light intensity, $a_k$ and $\alpha$ are constants, and n is a natural number; and a fifth step of calculating the resist pattern based on the light intensity distribution corrected in the fourth step, and a slice level set in advance.

Further features of the present invention will become apparent from the following description of exemplary embodiments with reference to the attached drawings.

BRIEF DESCRIPTION OF THE DRAWINGS

FIG. 10 is a flowchart of a resist pattern calculation method;

FIG. 11 is a view of reticle patterns used in modeling;

FIG. 16 is a graph showing the relationship between the light intensity $K_{SEMedge}$ and the duty;

FIGS. 17A to 17C are graphs showing the light intensity distributions of the reference pattern before and after correction; and FIG. 18 is a graph showing a comparison between calculation errors of resist patterns in the prior art technique and an Example of the present invention.

DESCRIPTION OF THE EMBODIMENTS

Figure 1:
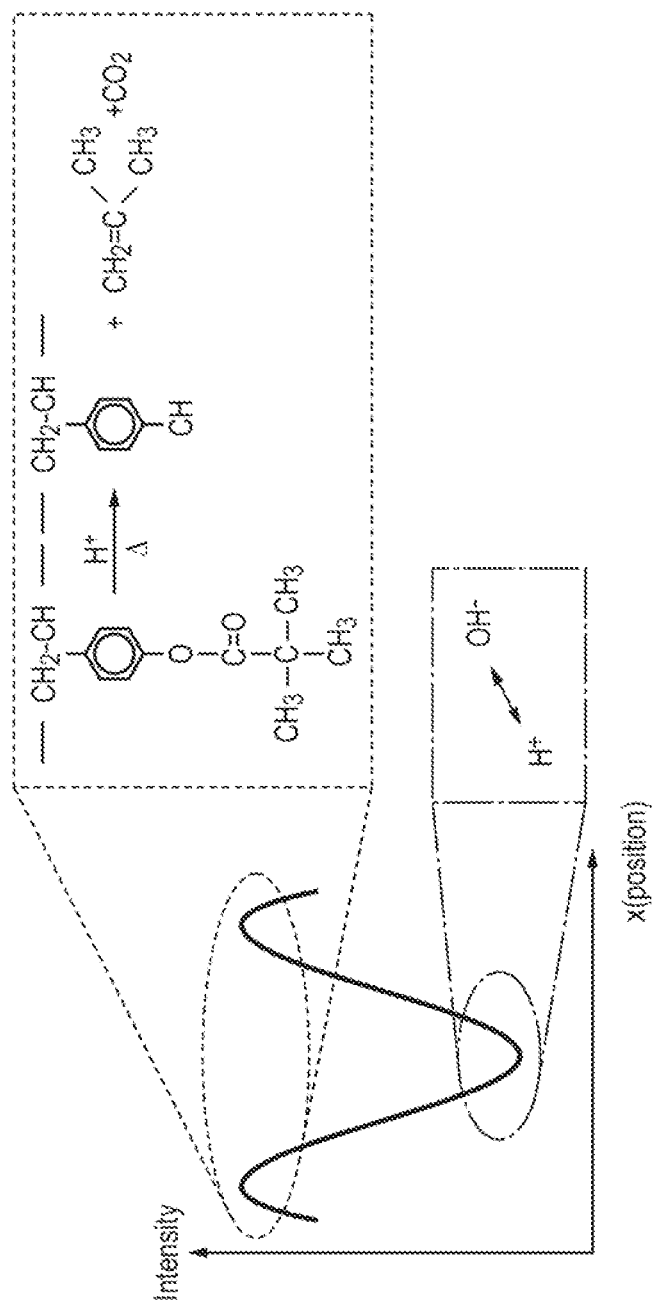
FIG. 1 is a schematic view of a chemical reaction produced during exposure.
Figure 2:
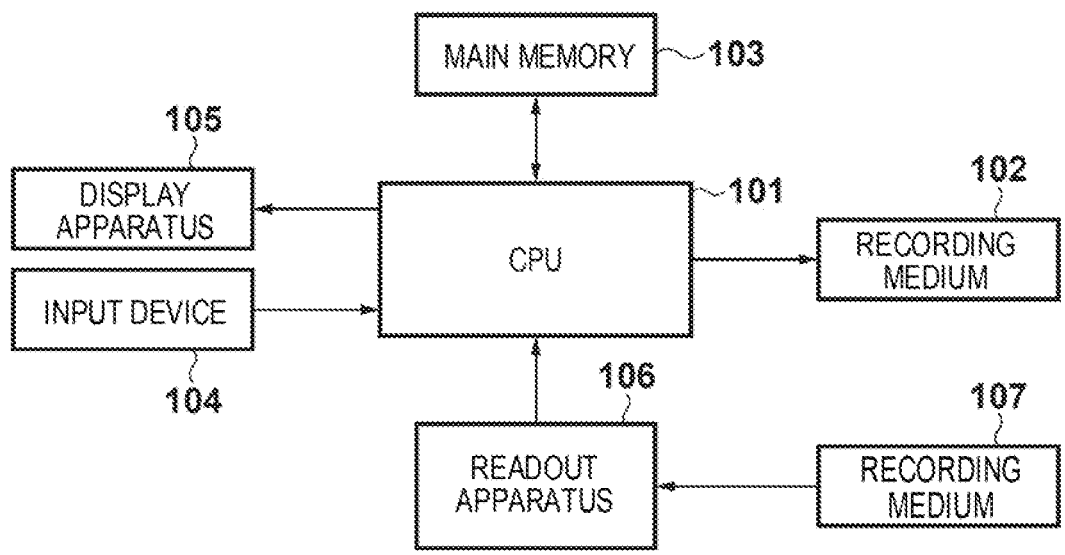
FIG. 2 is a block diagram showing the configuration of a computer which calculates a resist pattern.

In an embodiment of the present invention, a resist pattern formed on a substrate by projecting an image of the pattern of a reticle onto the resist by a projection optical system to expose the resist to light, and developing the exposed resist is calculated using a simulator. FIG. 2 shows the configuration of a computer equipped with this simulator. This computer includes a CPU 101, a recording medium 102 which stores programs and data, a main memory 103, an input device 104 such as a keyboard or a mouse, a display apparatus 105 such as a liquid crystal display, and a readout apparatus 106 which reads a recording medium 107. All of the recording medium 102, main memory 103, input device 104, display apparatus 105, and readout apparatus 106 are connected to the CPU 101. In this computer, the recording medium 107 which stores a program for calculating a resist pattern is mounted in the readout apparatus 106. The CPU 101 reads out the program from the recording medium 107, stores it on the recording medium 102, and executes it, thereby modeling and calculating a resist pattern. A resist pattern is modeled by comparing the measurement result of the critical dimension (CD) obtained by a scanning electron microscope (SEM) in an evaluation portion on a wafer exposed by an exposure apparatus, and the calculation result of this critical dimension obtained by the simulator. Also, a resist pattern is calculated by applying its modeling result to optical simulation to calculate an image of a reticle pattern.

Figure 3:
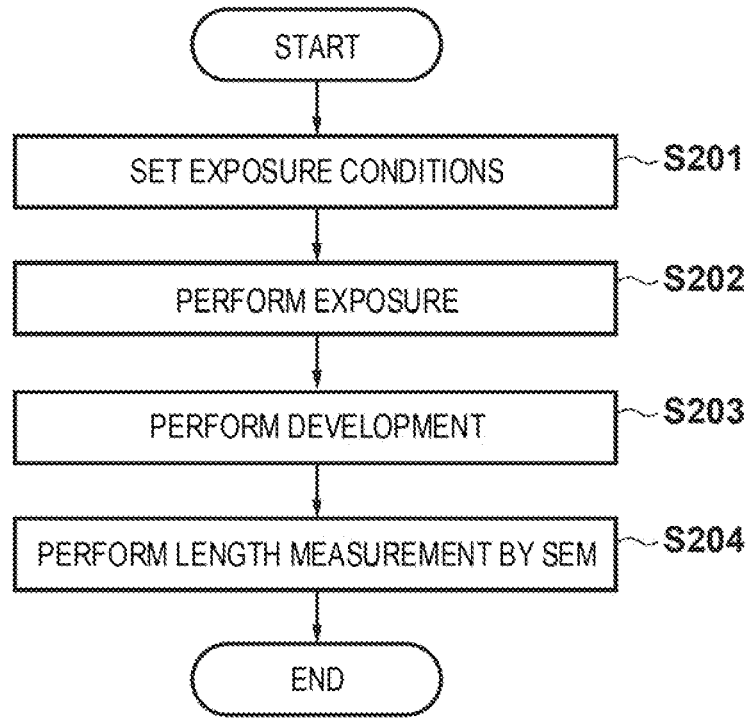
FIG. 3 is a flowchart of length measurement by an SEM.

FIG. 3 is a flowchart of length measurement by an SEM. In step S201, the exposure conditions such as the NA, the amount of exposure, the illumination shape, and the type of resist in exposure are determined. In step S202, a resist on a substrate (wafer) is exposed to light by an exposure apparatus under the exposure conditions determined in step S201. In step S203, the resist exposed in step S202 is developed by a developing apparatus. In step S204, length measurement of the resist pattern developed in step S203 is performed using an SEM.

Figure 4:
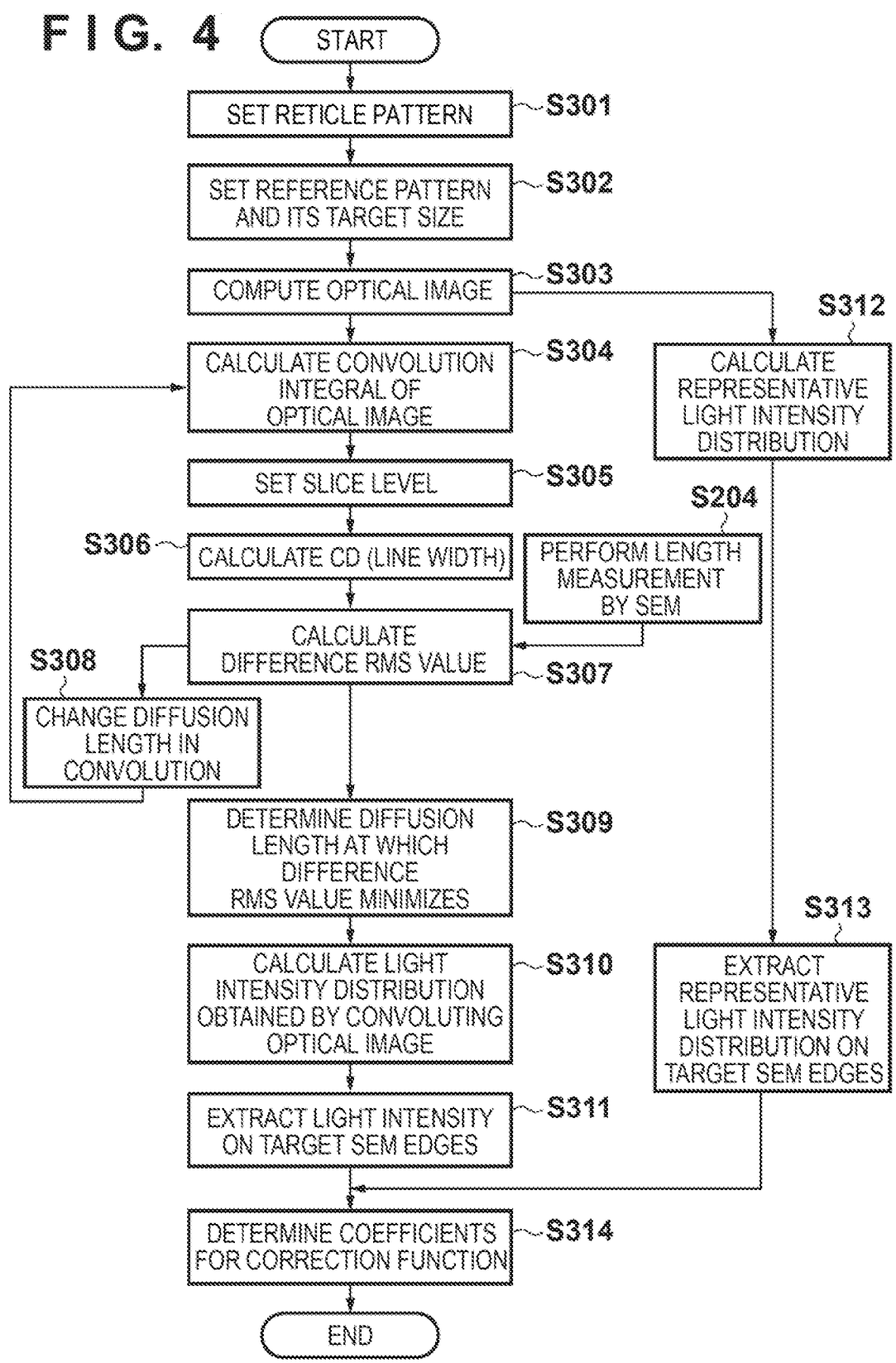
FIG. 4 is a flowchart for determining a correction function.
Figure 5:
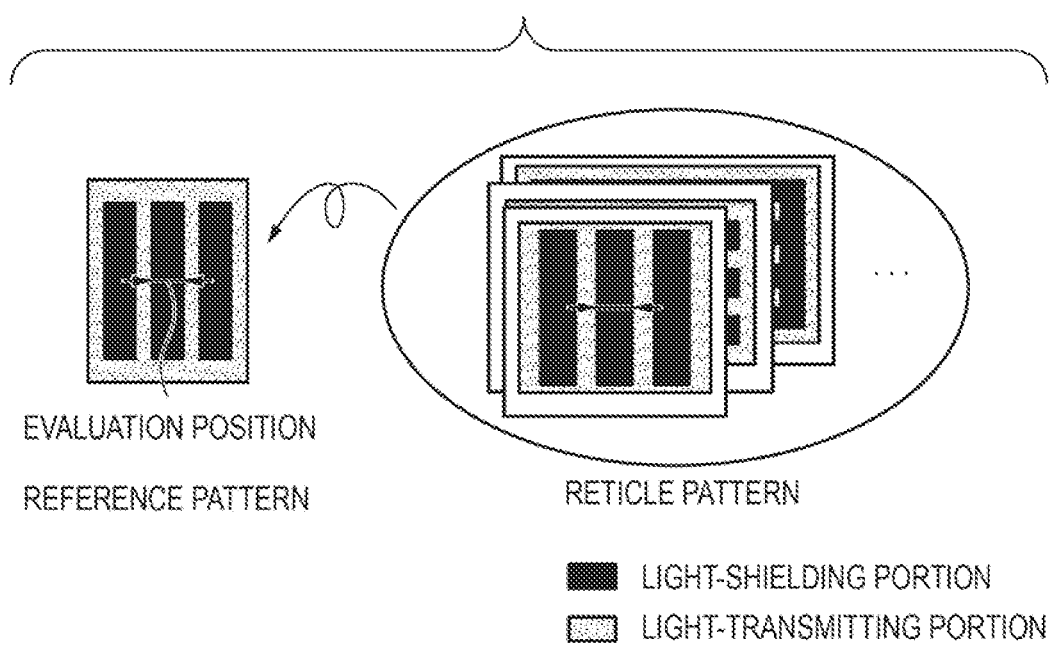
FIG. 5 is a view for explaining a reference pattern and its target size and evaluation position.

FIG. 4 is a flowchart showing modeling of a resist pattern. In step S301, a plurality of reticle patterns for use in modeling are set. In step S302, a reference pattern, to be selected from the plurality of reticle patterns set in step S301, and its target size and evaluation position are determined. For example, FIG. 5 is a view for explaining a target size and evaluation position for a reference pattern, and a line-and-space pattern having a given pitch is selected as the reference pattern from a plurality of reticle patterns, and the light-shielding portion at the center of the pattern is set as the evaluation position. Also, a value measured by, for example, an SEM at the set evaluation position is input as the target size. The input target size is to be used in step S305. In step S303, the simulator calculates the light intensity distribution of an optical image, which is formed on the resist based on the exposure conditions, for each of the reticle patterns for use in modeling, which are set in step S301 (first step). In step S304, the simulator convolutes the light intensity distributions of the optical images using a given diffusion length. In step S305, the simulator sets a slice level (an intensity in CD calculation) based on the target size and evaluation position of the reference pattern, which are determined in step S302. Note that a slice level may separately be set in advance. In step S306, the simulator calculates the CDs of the patterns for use in modeling, based on the slice level determined in step S305.

Figure 6:
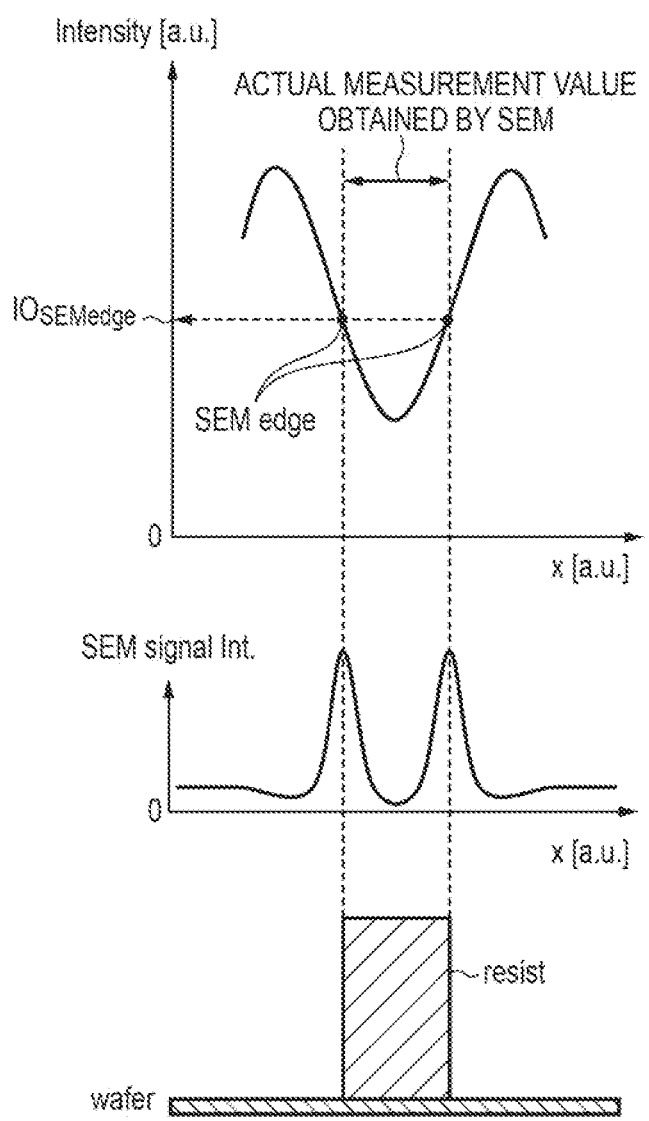
FIG. 6 is a graph for explaining SEM edges.

In step S307, the simulator compares the root-mean-square (RMS) value of the differences between the results of the CDs of the patterns for use in modeling, which are calculated in step S306, and those of the CDs of the patterns for use in modeling, which are measured by the SEM in step S204. In step S308, the simulator changes the diffusion length set in step S304. The simulator then returns the process to step S304, and repeats steps S304 to S307. In step S309, the simulator determines a diffusion length at which the RMS difference minimizes, among those obtained in the calculation results by repeating steps S304 to S307. In step S310, the simulator calculates the light intensity distribution obtained by convolution using the diffusion length (first diffusion length) determined in step S309 (second step). The diffusion length (first diffusion length) determined in step S309 is, for example, 50 nm or less. The light intensity distribution calculated in step S310 will be referred to as the light intensity distribution before correction hereinafter. In step S311, the simulator extracts a light intensity $I0_{SEMedge}$ before correction. SEM edges will be described herein with reference to FIG. 6. The edges of the exposed resist can be detected based on a change in signal intensity of secondary electrons when this resist is measured by an SEM, as shown in FIG. 6. The SEM edges mean the coordinates of the two edges of the resist to be measured, as shown in FIG. 6. Also, $I0_{SEMedge}$ is the light intensity on the SEM edges, which is calculated by the simulator.

Figure 7:
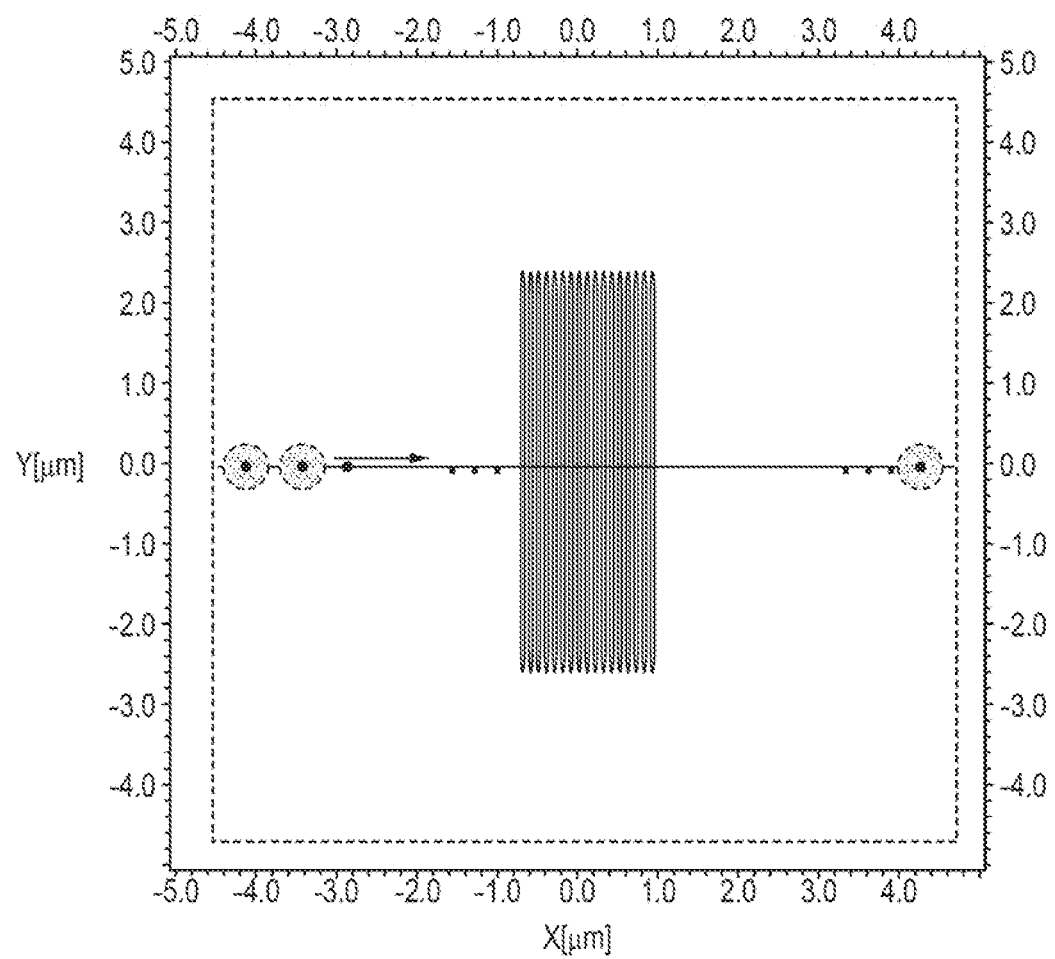
FIG. 7 is a map for explaining a representative light intensity J.

In step S312, the simulator calculates the value of a representative light intensity from the light intensity distribution computed based on the optical image (third step). FIG. 7 shows one of the resist patterns set in step S301. Referring to FIG. 7, a representative light intensity J that is representative of the light intensities in a region which has a predetermined size and includes a point on a line defined within the plane of the resist is calculated for each of points. Referring again to FIG. 7, the region used to calculate a representative light intensity is a circle having a radius of X nm and each point as its center. This calculation operation is performed for all points on that line. Although the minimum value of the light intensity is calculated as the representative light intensity J in this embodiment, the representative light intensity J is not limited to the minimum value of the light intensity, and may be its maximum value, its average value, or a combination thereof within the region. The representative light intensity J may be a value neighboring the minimum value. The range X in which the representative light intensity J is to be calculated is desirably at least equal to or wider than a minimum line width.

Assuming an ArF immersion exposure apparatus having k1=0.25, the minimum line width is 35 nm, so the information of at least a range equal to or wider than this minimum line width must be calculated. Hence, when a certain plotted point is assumed as the center of the range X, the range X is desirably 17 nm, that is, approximately half of the minimum line width or more. Also, a quencher is less likely to exert an influence on a range exceeding 1 µm, so the range X is desirably 1 µm or less. In summary, the range X is desirably 17 nm (inclusive) to 1 µm (inclusive). An example of the calculated distribution will be described later in reference to an Example. The shape of the region used to calculate the representative light intensity J shown in FIG. 7 is a circle. However, the shape of this region is not limited to a circle, and may be, for example, a square because many device structures have quadrangular shapes. If the shape of the region used to calculate the representative light intensity J is a square, this square can be 34 nm (inclusive) to 2 µm (inclusive) on each side. Also, although a representative light intensity is calculated from a light intensity distribution computed based on an optical image in this embodiment, the representative light intensity J may be obtained by convoluting a light intensity distribution, computed based on an optical image, using an arbitrary diffusion length.

Figure 8:
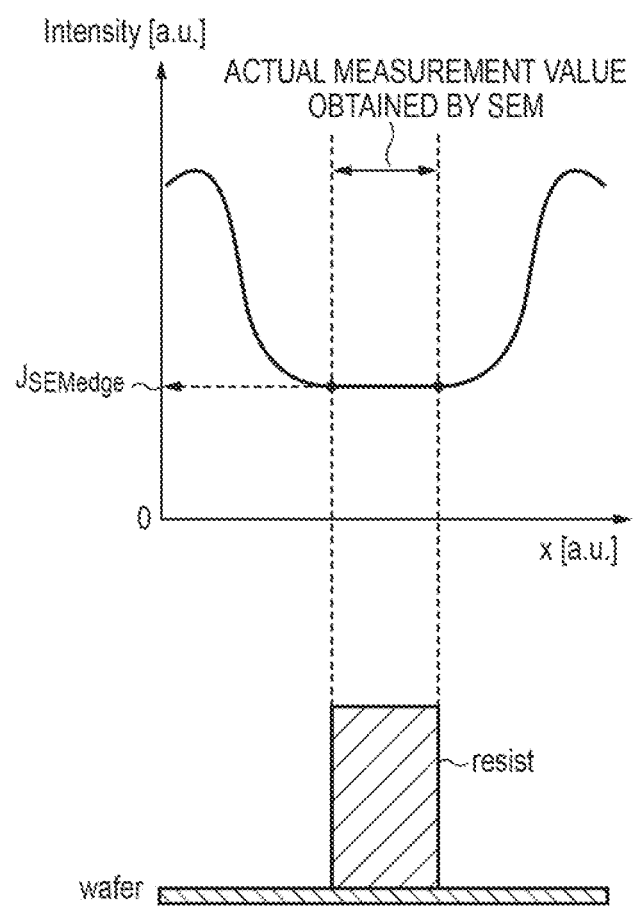
FIG. 8 is a graph for explaining extraction of a representative light intensity $J_{SEMedge}$ on the SEM edge.

In step S313, the simulator extracts a representative light intensity $J_{SEMedge}$ on the target SEM edges, as shown in FIG. 8, based on the distribution of the representative light intensity calculated in step S312. In step S314, the simulator models coefficients for a correction function to determine the coefficients. In determining the coefficients, the light intensity $I0_{SEMedge}$ before correction on the SEM edges extracted in step S311, and the representative light intensity $J_{SEMedge}$ obtained in step S313 are used. The simulator determines a correction function including a first function having the representative light intensity $J_{SEMedge}$ as a variable, and adds it to the light intensity $I0_{SEMedge}$, thereby correcting the light intensity $I0_{SEMedge}$ before correction on the SEM edges (fourth step). At this time, a correction function $f(J_{SEMedge})$ for the light intensity on the SEM edges is given by:

$$f(J_{SEMedge}) = \left\{\sum_{k=0}^{n}(a_k J_{SEMedge}^k)\right\}\exp(-\alpha J_{SEMedge}) \quad (1)$$

where $a_k$ and $\alpha$ are constants, and n is a natural number. Note that in this equation, constraints $f(J_{SEMedge})|_{JSEMedge=0}=0$ and $f(J_{SEMedge})|_{JSEMedge=1}=0$ are given for the sake of easy calculation of the constants $a_k$ and $\alpha$. In equation (1), not all of the constants $a_k$ and $\alpha$ are simultaneously zero. Therefore, the correction function $f(J_{SEMedge})$ in this embodiment is generally the product of an exponential function and a polynomial having the representative light intensity $J_{SEMedge}$ as a variable. However, if the constants $a_k$ are all zero (that is, the constant $\alpha$ is not zero), the correction function $f(J_{SEMedge})$ is expressed as an exponential function having the representative light intensity $J_{SEMedge}$ as a variable. In contrast, if the constant $\alpha$ is zero (that is, at least one of the constants $a_k$ is not zero), the correction function $f(J_{SEMedge})$ is expressed as a polynomial having the representative light intensity $J_{SEMedge}$ as a variable.

Using equation (1), a light intensity $I_{SEMedge}$ after correction on the SEM edges is given by:

$$I_{SEMedge}=I0_{SEMedge}+f(J_{SEMedge}) \quad (2)$$

When the constants $a_k$ and $\alpha$ are fixed, the light intensity $I_{SEMedge}$ after correction can be determined using equation (2), so the light intensity on the SEM edges can be calculated for each pattern. Let $Ip_{SEMedge}$ be the light intensity after correction, and $Ia_{SEMedge}$ be the average of the light intensities $Ip_{SEMedge}$ after correction for this pattern. Then, an evaluation function C is defined, using the light intensity $Ip_{SEMedge}$ and the average $Ia_{SEMedge}$, as:

$$C = \sum_{pattern}\left\{\left(\frac{Ip_{SEMedge}-Ia_{SEMedge}}{Ia_{SEMedge}}\right)^2 + \left(\frac{Ip_{SEMedge,d2}}{Ip_{SEMedge,d1}}-\frac{d_1}{d_2}\right)^2\right\} \quad (3)$$

where $Ip_{SEMedge,d1}$ and $Ip_{SEMedge,d2}$ are the light intensities on the SEM edges when the resist is exposed to light at two different amounts of exposure $d_1$ and $d_2$. The first term of the right-hand side of equation (3) represents the sensitivity to the pattern, and its second term represents the sensitivity to the amount of exposure. Although the light intensities $I_{SEMedge}$ at the two different amounts of exposure are used in this embodiment, more than two amounts of exposure may be used. The coefficients $a_k$ and $\alpha$ in modeling are set such that the value of the evaluation function C presented in equation (3), for example, minimizes. The coefficients $a_k$ and $\alpha$ when the value of the evaluation function C minimizes can be determined by, for example, the quasi-Newton method that can be implemented by, for example, a solver such as Excel. An example of the calculation of coefficients and the relationship between the correction function $f(J_{SEMedge})$ and the representative light intensity $J_{SEMedge}$ based on the calculated coefficients will be described later in reference to the Example.

Figure 9A:
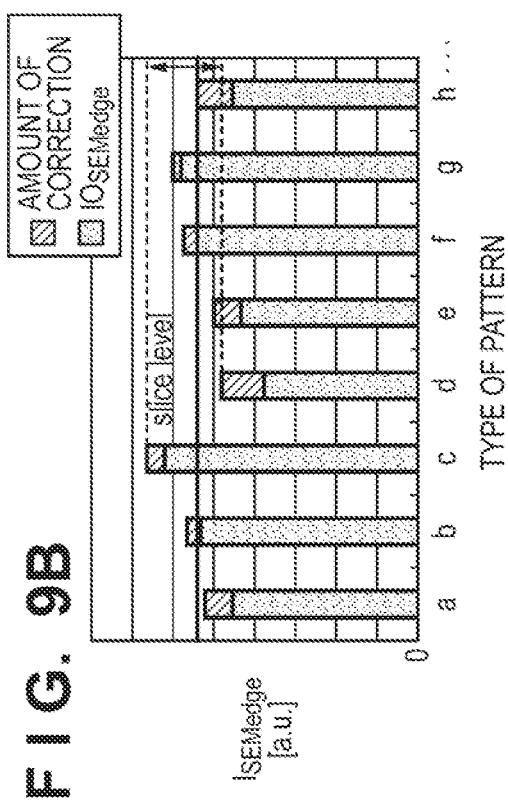
FIGS. 9A to 9D are graphs for explaining a reduction in evaluation function in modeling patterns for use in modeling.
Figure 9B:
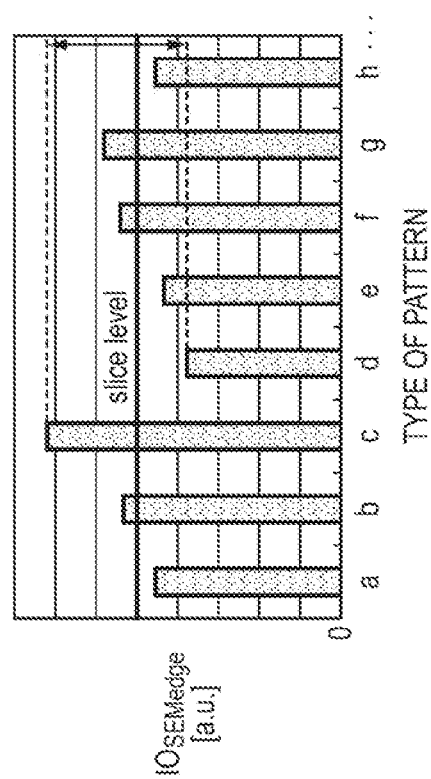
Figure 9C:
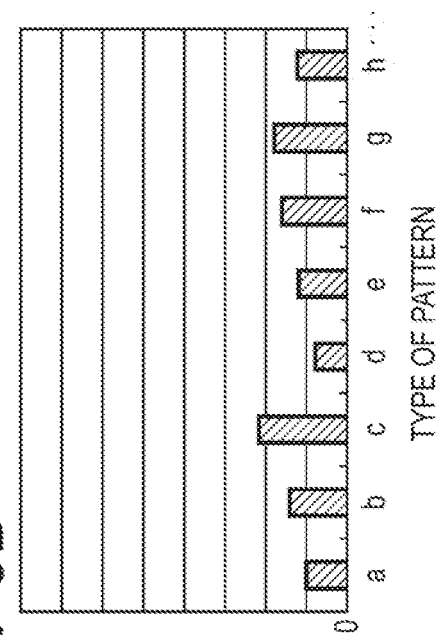
Figure 9D:
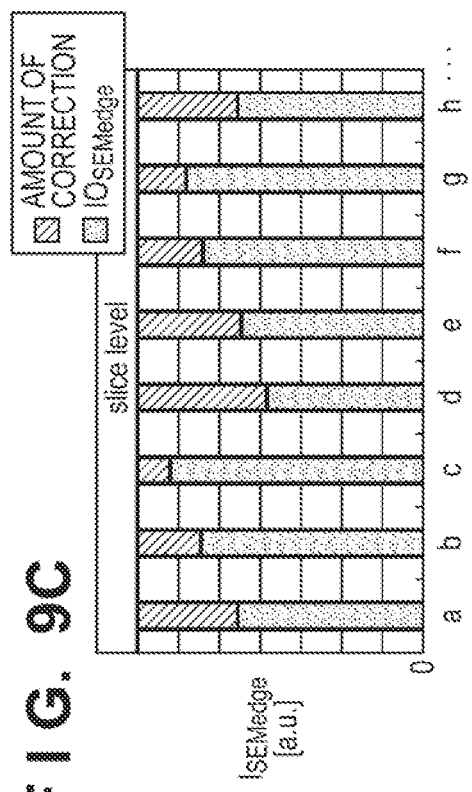

The meaning of a reduction in value of the evaluation function C will be explained below. FIG. 9A is a graph showing the relationship between the type of pattern and the light intensity $I0_{SEMedge}$. From a different viewpoint, the relationship shown in FIG. 9A means that an actual measurement result can be predicted as long as a slice level is determined for the value of the light intensity $I0_{SEMedge}$ for each pattern. As can be seen from FIG. 9A, the value of the light intensity $I0_{SEMedge}$ varies in each individual pattern. This variation means that when the CD is calculated upon determining a given slice level, this variation is so considerable that the prediction error of a resist pattern is large, that is, prediction is inaccurate. FIG. 9C is a graph showing the light intensity $I_{SEMedge}$ on the SEM edges after correction on the ordinate, and shows an ideal form when the variation in light intensity $I0_{SEMedge}$ shown in FIG. 9A is corrected by summing up the amounts of intensity correction using a correction function having the representative light intensity $J_{SEMedge}$ shown in FIG. 9D as a variable. As shown in FIG. 9C, when the variation in light intensity $I_{SEMedge}$ after correction can be canceled, and the CD is calculated upon determining a slice level in this state, the prediction error of a resist pattern can be eliminated, that is, a resist pattern can be calculated accurately. This explains the meaning of a reduction in value of the evaluation function C. However, in practice, it is difficult to cancel the variation in light intensity $I_{SEMedge}$, as shown in FIG. 9C. Hence, it is realistic to make the variation in light intensity $I_{SEMedge}$ after correction smaller than that before correction shown in FIG. 9A so as to reduce the prediction error, as shown in FIG. 9B. In the above-mentioned way, a correction function having the representative light intensity $J_{SEMedge}$ as a variable is used to perform modeling which takes into account the magnitude of the intensity of exposure light. Also, each coefficient value may be determined using an optimization method such as the downhill simplex method such that the value of the evaluation function C expressed as the root-mean-square value of the differences between the line widths of patterns to be modeled and those of resist patterns obtained by exposure processing falls within a tolerance.

To take into account the influence of a flare, not only a function (first function) describing the representative light intensity, but also that (second function) describing a light intensity distribution obtained by convolution using a second diffusion length larger than the first diffusion length set in step S309 may be included in the correction function (sixth step). The flare is stray light generated due to, for example, undesirable reflection and scattering by a lens of the exposure apparatus. The light intensity distribution obtained by convolution using the larger diffusion length physically represents the duty (the ratio of white to black). An example of this representation will be clarified in the Example below. In this case, letting $K_{SEMedge}$ be the light intensity on the SEM edges in the distribution obtained by convolution using the larger diffusion length, the correction function is given by:

$$f(J_{SEMedge}, K_{SEMedge}) = \left\{\sum_{k=0}^{n}(a_k J_{SEMedge}^k)\right\}\exp(-\alpha J_{SEMedge}) + \left\{\sum_{l=0}^{m}(b_l K_{SEMedge}^l)\right\}\exp(-\beta K_{SEMedge}) \quad (4)$$

where $b_l$ and $\beta$ are constants, and m is a natural number.

Also, the light intensity distribution after correction is given by:

$$I_{SEMedge} = I0_{SEMedge} \leftrightarrows f(J_{SEMedge}, K_{SEMedge}) \quad (5)$$

The second diffusion length used to calculate the variable K in the second correction function falls within the range of 50 nm (inclusive) to 200 μm (inclusive), on which a flare exerts an influence. A method of calculating a resist pattern using a correction function will be described next with reference to FIG. 10. In step S401, not only the patterns for use in modeling, shown in the flowchart of FIG. 4, but also reticle patterns to which the modeling result is to be applied are set. In step S402, the simulator calculates the light intensity distribution of an optical image, which is formed on the wafer, not only for each of the reticle patterns used in modeling in step S401 in the flowchart shown in FIG. 4, but also for each of the set reticle patterns (first step). In step S403, the simulator convolutes the light intensity distributions, calculated in step S402, using the first diffusion length determined in step S309 (second step). In step S404, the simulator calculates the distribution of the representative light intensity $J_{SEMedge}$ from the light intensity distributions calculated in step S402 (third step). In step S405, the simulator calculates the light intensity $I_{SEMedge}$ after correction, using the correction function determined in step S314 of the flowchart shown in FIG. 4 (fourth step). The simulator uses the light intensity on the SEM edges in modeling, which is applied to data of the entire light intensity distribution when the modeling result is applied. That is, the coefficients determined in step S314 are substituted into relations presented in equations (1) and (2), and the obtained relations are applied to all plotted points. An example of a comparison between the light intensity distributions before and after correction will be described later.

In step S406, the simulator sets a slice level corresponding to the evaluation position of the pattern to serve as a reference in the light intensity distribution after correction of the reticle pattern to which the modeling result obtained in step S405 is to be applied. In step S407, the simulator calculates the CD of a reticle pattern to which the modeling result is to be applied, based on the distribution of the light intensity $I_{SEMedge}$ corrected in step S405, and the slice level set in step S406, thereby calculating a resist pattern (fifth step). This makes it possible to calculate a resist pattern with higher accuracy than in the prior art technique. A comparison between the prior art technique and the present invention upon applying the modeling result will be described in later in reference to the Example.

EXAMPLE

The Example in the above-described embodiment will be described. In step S301, a plurality of reticle patterns for use in modeling are set. FIG. 11 is a schematic view of patterns used. In pattern A, all bars have a length W=5 μm. Although pattern A has three lines in FIG. 11 for the sake of simplicity, it has 17 lines in practice. Also, pattern A has lines and spaces which are periodically arranged in the full field of pattern A, and the central line as an evaluation portion among the 17 lines. Twenty-five types of patterns A are obtained by defining different combinations of lines and space sizes. In pattern B, all bars have a length W=2 μm. Although pattern B has three lines in FIG. 11 for the sake of simplicity, it has nine lines in practice. Also, pattern B has lines, spaces, and gaps which are periodically arranged in the full field of pattern B, and the central line as an evaluation portion among the nine lines. Eight types of patterns B are obtained by defining different combinations of line, space, and gap sizes. Pattern C is a reticle pattern obtained by inverting the light-shielding portion and light-transmitting portion of pattern B. Pattern C employs the same size definition as pattern B, and five types of patterns C are used. FIG. 18 describes actual sizes. Although the above-mentioned total of 38 types of patterns are used in this Example, the types of patterns, the lengths and number of bars of these patterns, and the sizes of lines, spaces, and gaps of these patterns are not limited to patterns having the above-mentioned numerical values.

In step S302, a reference pattern to be selected from the plurality of reticle patterns set in step S301, and its target size and evaluation position are determined. The reference pattern means herein a pattern used to determine the amount of exposure on a reticle pattern. In this Example, the 50-nm line-and-space pattern shown in FIG. 11 is determined as the reference pattern. In step S303, the simulator calculates the light intensity distribution of an optical image, which is formed on the wafer, for each of the reticle patterns for use in modeling, which are set in step S301. In step S304, the simulator convolutes the light intensity distributions of the optical images using a given diffusion length. In step S305, the simulator sets a slice level. In this Example, the slice level is set to a light intensity (amount of exposure) which matches the actual size of the central bar in the reference pattern. In step S306, the simulator calculates the CDs of the various patterns based on the slice level determined in step S305. In step S307, the simulator compares the RMS (root-mean-square) value of the differences between the results of the CDs of the patterns for use in modeling, which are calculated in step S306, and those of the CDs of the patterns for use in modeling, which are measured by the SEM in step S204. In step S308, the simulator changes the diffusion length set in step S304. The simulator then repeats steps S304 to S307. In this Example, calculation is repeatedly done by changing the diffusion length within the range of 50 nm or less. Note that the sequence until measurement by the SEM is the same as in the flowchart shown in FIG.

3. Also, exposure is done using annular illumination having an NA of 1.35 and an annular zone ratio of 0.90/0.72, and a wafer on which a 39-nm BARC, a 42-nm TARC, a 90-nm resist, and a 35-nm top coat are formed in turn from the wafer side.

Figure 12A:
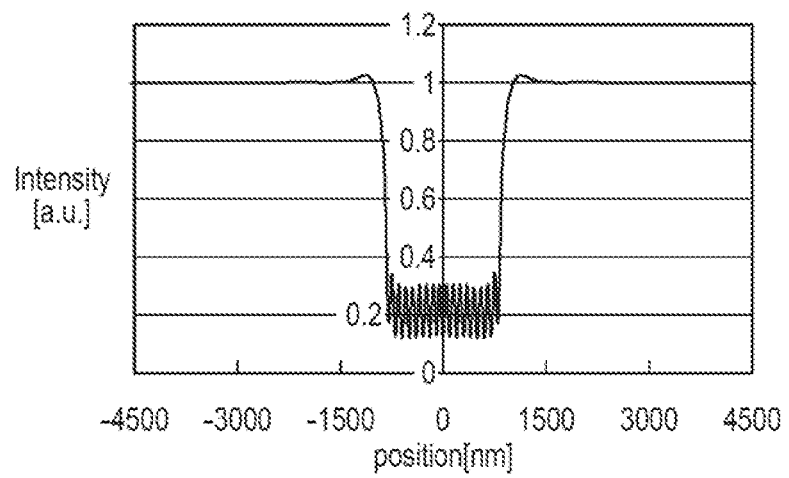
FIGS. 12A and 12B are graphs showing the light intensity distribution of an optical image, and the representative light intensity distribution, respectively.
Figure 12B:
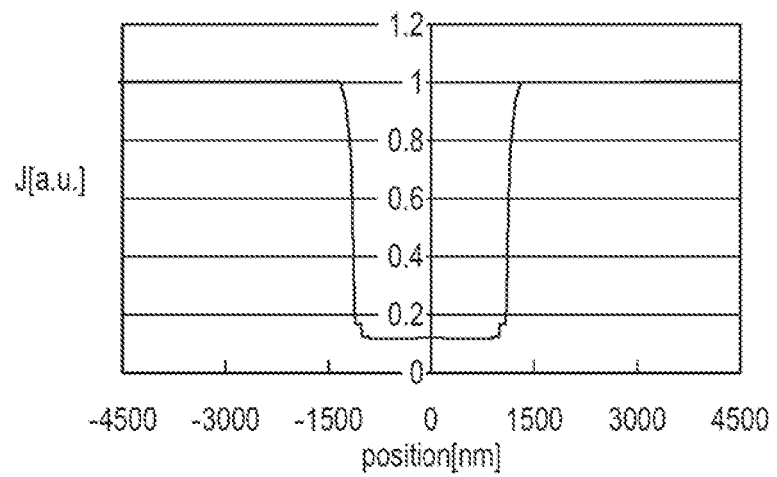
Figure 13A:
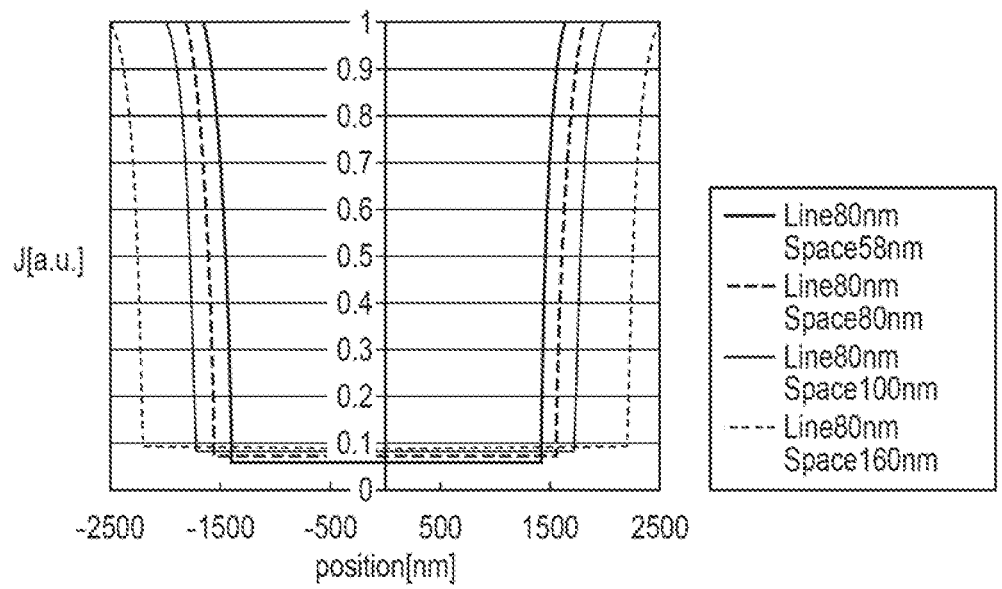
FIGS. 13A and 13B are graphs showing the representative light intensity distributions of patterns having different space sizes and line sizes, respectively.
Figure 13B:
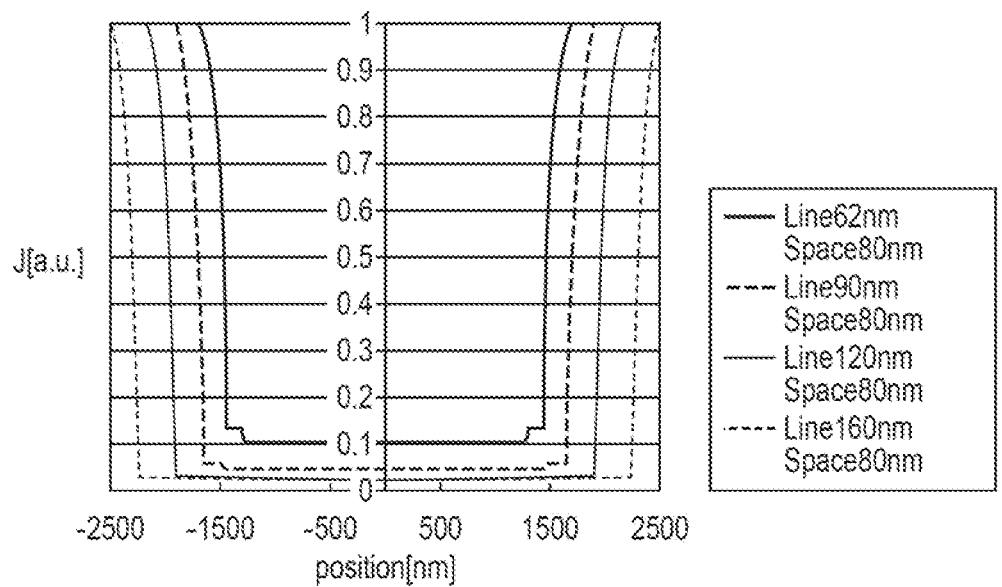

In step S309, the simulator determines a diffusion length at which the RMS value of the difference minimizes. In this Example, this diffusion length is 19.3 nm. In step S310, the simulator calculates the light intensity distribution before correction obtained by convolution using the diffusion length determined in step S309. In step S311, the simulator extracts a light intensity $I0_{SEMedge}$ before correction on the SEM edges. In step S312, the simulator calculates the minimum value J of the light intensity in the peripheral region as a representative light intensity from the light intensity distribution computed based on the optical image. In this Example, the minimum value of the intensity of ambient light is extracted from the light intensity distribution computed based on the optical image. FIG. 12A shows the light intensity distribution in a portion indicated by a line defining the central portion of the bars in the reference pattern, as shown in FIG. 7. Also, FIG. 12B shows the distribution of the light intensity J obtained by extracting the minimum value of the light intensity within a region which has a radius of 300 nm and falls within the range of 17 nm (inclusive) to 1 µm (inclusive) on that line. FIG. 13A illustrates an example of the result of executing the method as mentioned above for patterns for use in modeling, which are obtained when the line size is fixed at 80 nm and the space size is changed. FIG. 13B illustrates an example of the result of executing the method as mentioned above for patterns for use in modeling, which are obtained when the space size is fixed at 80 nm and the line size is changed. As can be seen from FIGS. 13A and 13B, the possible range of light intensities J differs depending on the line size (the size of the light-shielding portion).

Figure 14:
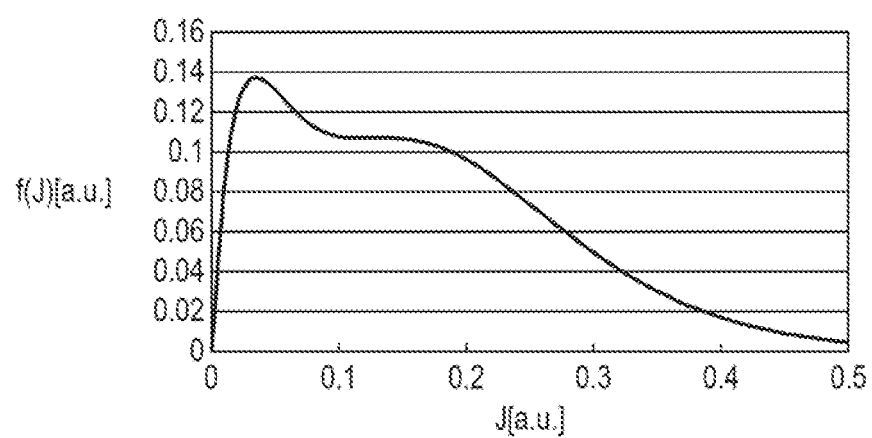
FIG. 14 is a graph showing a correction function.
Figure 15A:
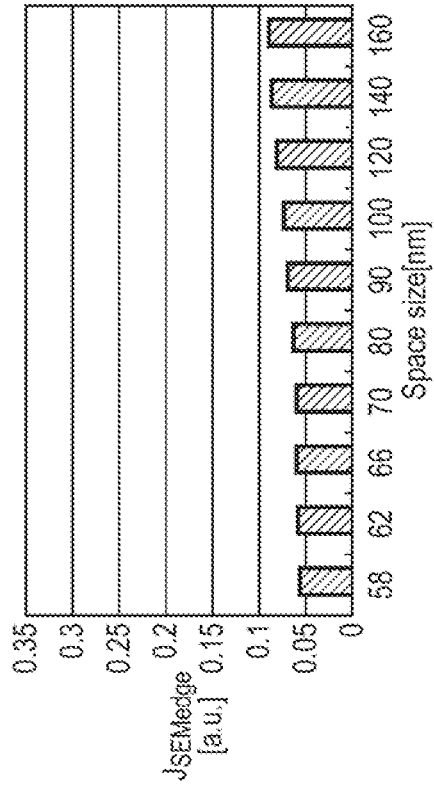
FIG. 15A is a graph illustrating an example of the relationship between the light intensity $I0_{SEMedge}$ and the space size.
Figure 15B:
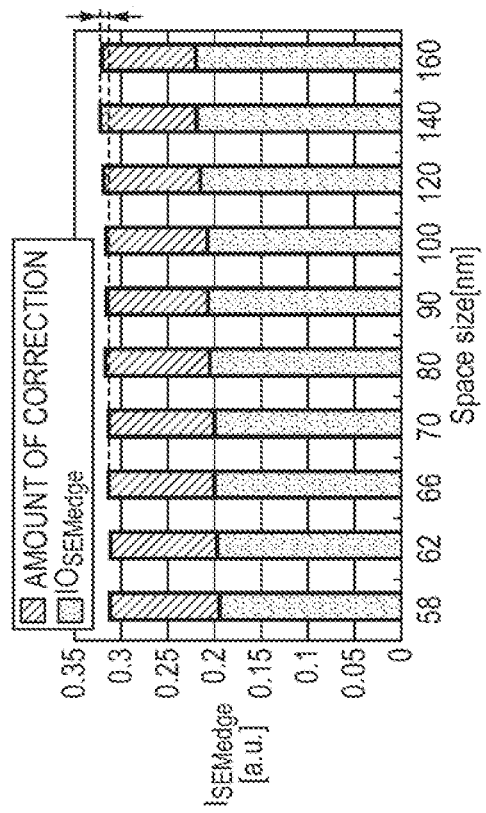
FIG. 15B is a graph illustrating an example of the relationship between the representative light intensity $J_{SEMedge}$ and the space size.
Figure 15C:
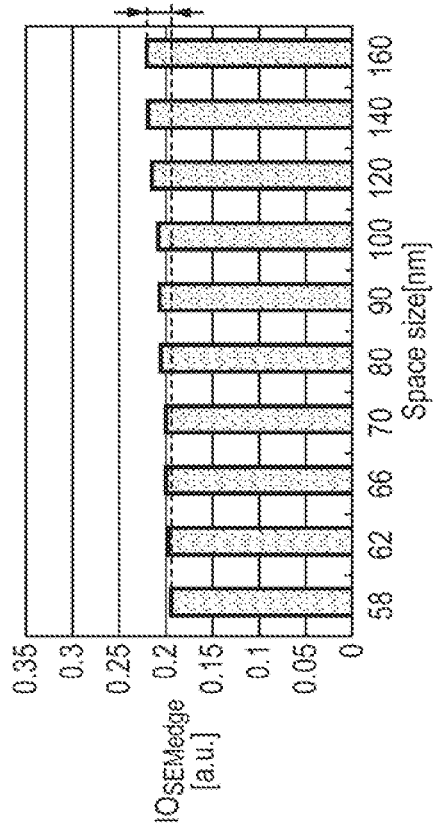
FIG. 15C is a graph illustrating an example of the relationship between the correction function $f(J_{SEMedge})$ and the space size.
Figure 15D:
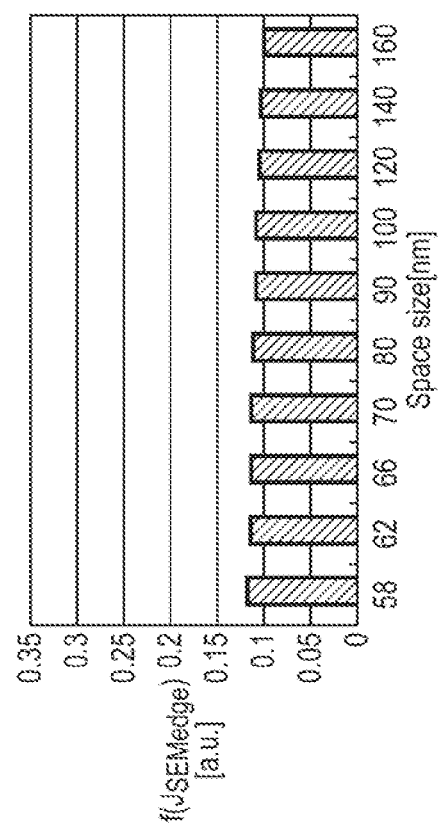
FIG. 15D is a graph illustrating an example of the relationship between the light intensity $I_{SEMedge}$ and the space size.

In step S313, the simulator extracts a representative light intensity $J_{SEMedge}$ on the target SEM edges, based on the distribution of the representative light intensity calculated in step S312. In step S314, the simulator models coefficients for a correction function to determine the coefficients. In determining the coefficients, light intensities $I_{SEMedge}$ on the SEM edges at two different amounts of exposure $d_1=290$ J/m$^2$ and $d_2=300$ J/m$^2$ are used. Although the light intensities $I_{SEMedge}$ at two different amounts of exposure are used in this Example, more than two amounts of exposure may be used. Also, the simulator determines the coefficients using $f(J_{SEMedge})|_{JSEMedge=1}=0$ and a quartic equation which uses a polynomial having $a_0=0$. The results of the coefficient values are $a_1=11.5$, $a_2=-155.3$, $a_3=1197.6$, $a_4=-1053.8$, and $\alpha=18.6$. FIG. 14 shows the relationship between the correction function $f(J_{SEMedge})$ and the representative light intensity $J_{SEMedge}$ when these results of the coefficient values are used.

FIGS. 15A to 15D show the results of the light intensity before correction, the representative light intensity, the correction function, and the light intensity after correction, for each of line-and-space patterns which are obtained when the line size is fixed at 80 nm and the space size is changed. All these graphs show the changed space size on the abscissa. As can be seen from FIGS. 15A to 15D, the use of the correction function $f(J_{SEMedge})$ having the representative light intensity as a variable makes the variation in light intensity smaller in the light intensity $I_{SEMedge}$ after correction than in the light intensity $I0_{SEMedge}$ before correction. As described above, modeling which takes into consideration the information of the magnitude of the intensity of exposure light is performed using a representative light intensity. Further, to perform modeling which takes into consideration the influence of a flare, not only the distribution of the representative light intensity, but also the function describing a light intensity distribution obtained by convoluting a light intensity distribution, obtained by reticle projection, using a larger diffusion length need only be included into the correction function. The light intensity distribution K obtained by convolution using the larger diffusion length physically represents the duty (the ratio of white to black; Space/Line) of the pattern. FIG. 16 illustrates an example of this light intensity distribution. FIG. 16 is a graph showing the relationship between the light intensity $K_{SEMedge}$ on the SEM edges and the duty in a line-and-space pattern obtained by convolution using a diffusion length of 300 nm that is greatly larger than the diffusion length (19.3 nm) determined in step S309. As can be seen from FIG. 16, the light intensity $K_{SEMedge}$ on the SEM edges and the duty have a given correlation. Therefore, the simultaneous use of the representative light intensity $J_{SEMedge}$ and the light intensity $K_{SEMedge}$ calculated using a relatively large diffusion length allows modeling which reflects the magnitude of the intensity of exposure light and the duty.

The modeling result is applied next. This operation will be described with reference to a flowchart shown in FIG. 10. In step S401, reticle patterns to which modeling is to be applied are set. In this Example, a total of 38 types of reticle patterns set in step S301 are used. In step S402, the simulator calculates the light intensity distribution of an optical image formed on the wafer, for each of the reticle patterns set in step S401. In step S403, the simulator convolutes the light intensity distributions of the optical images using the diffusion length determined in step S309. The diffusion length in this Example is 19.3 nm. In step S404, the simulator calculates the distribution of the representative light intensity from the light intensity distributions of the optical images calculated in step S402. In step S405, the simulator creates a light intensity distribution after correction for each of the reticle patterns set in step S401, based on the coefficients of the correction function determined in step S314 of the flowchart shown in FIG. 4. FIGS. 17A to 17C exemplify cases in which relations presented in equations (1) and (2) are applied on an evaluation line for the reference pattern, in which FIG. 17A is a graph showing the light intensity distribution before correction, FIG. 17B is a graph showing the distribution of the representative light intensity J, and FIG. 17C is a graph showing a comparison between the light intensity distributions before and after correction. FIG. 17C reveals that the light intensity distribution after correction has a minimum level higher than that of the light intensity distribution before correction, so the light intensity distribution before correction can be corrected without significantly changing its shape.

In step S406, the simulator sets a slice level for the light intensity distribution after correction obtained in step S405. In this Example, the slice level is set to an intensity which matches the actual size of the central bar in the reference pattern. In step S407, the simulator calculates the CDs of the patterns set in step S401, based on the slice level determined in step S406, thereby calculating a resist pattern. FIG. 18 is a graph showing the calculation accuracies of resist patterns in the prior art technique described in Japanese Patent Laid-Open No. 08-148404 and this Example. FIG. 18 shows the shift (positive or negative shift) of the calculated value of the resist pattern with respect to an actual measurement value obtained by an SEM on the ordinate, and the size of the reticle pattern used in modeling on the abscissa (unit:

nm). The definition of patterns A, B, and C, and the sizes of lines, spaces, and gaps in FIG. 18 correspond to that in FIG. 11. FIG. 18 reveals that the errors of most of the calculated resist patterns are smaller in this Embodiment than in the prior art technique. The fact that the RMS value of the errors of these resist patterns is 8.08 nm in the prior art but is 2.63 nm in this Example also reveals that the resist patterns can be calculated with higher accuracy in this Example.

Although a resist pattern is calculated with no concern for the influence of, for example, aberrations produced by the projection optical system in this Example, it can also be calculated by taking into account the influence of, for example, aberrations produced by the projection optical system because the same mode as in this Example is practicable. Also, this Example can be used in combination with an operation for optimizing the exposure conditions such as the effective light source. Aspects of the present invention can also be realized by a computer of a system or apparatus (or devices such as a CPU or MPU) that reads out and executes a program recorded on a memory device to perform the functions of the above-described embodiment(s), and by a method, the steps of which are performed by a computer of a system or apparatus by, for example, reading out and executing a program recorded on a memory device to perform the functions of the above-described embodiment(s). For this purpose, the program is provided to the computer for example via a network or from a recording medium of various types serving as the memory device (for example, computer-readable medium). In such a case, the system or apparatus, and the recording medium where the program is stored, are included as being within the scope of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-234914 filed Oct. 19, 2010, which is hereby incorporated by reference herein in its entirety.

What is claimed is:

1. A non-transitory computer-readable medium storing a program for causing a computer to execute a calculation method of calculating a resist pattern formed on a substrate by a resist-pattern forming method, the resist pattern being used for fabricating a device, the calculation method including:
   a first step of calculating a light intensity distribution of an optical image formed on the resist, based on a pattern of a reticle and an exposure condition;
   a second step of convoluting, using a first diffusion length representing diffusion in the resist, the light intensity distribution calculated in the first step;
   a third step of calculating a representative light intensity for each of a plurality of points within a plane of the resist, that is representative of light intensities in a region which has a predetermined size and includes each of the plurality of points, using the light intensity distribution calculated in the first step or the light intensity distribution convoluted in the second step;
   a fourth step of correcting the light intensity distribution convoluted in the second step by adding, to the light intensity distribution convoluted in the second step, a correction function including a first function given by:

$$\left\{\sum_{k=0}^{n}(a_k J^k)\right\}\exp(-\alpha J),$$

where J is the distribution of the representative light intensity, $a_k$ and $\alpha$ are constants, and n is a natural number; and
   a fifth step of calculating the resist pattern based on the light intensity distribution corrected in the fourth step, and a slice level set in advance,
   wherein the resist-pattern forming method comprises the steps of:
   exposing the resist on a substrate to light via the pattern of the reticle and a projection optical system using the light intensity distribution corrected in the fourth step; and
   developing the exposed resist on the substrate.

2. The medium according to claim 1, wherein:
   the region is one of a circular region having a radius of 17 nm (inclusive) to 1 µm (inclusive) and the point as a center thereof, or a square region that is 34 nm (inclusive) to 2 µm (inclusive) on each side, and
   the representative light intensity is one of a minimum value, a maximum value, or an average of the light intensities in the region.

3. The medium according to claim 1, further comprising:
   a sixth step of convoluting the light intensity distribution, calculated in the first step, using a second diffusion length larger than the first diffusion length,
   wherein the correction function includes not only the first function but also a second function given by:

$$\left\{\sum_{l=0}^{m}(b_l K^l)\right\}\exp(-\beta K),$$

where K is the light intensity distribution convoluted in the sixth step, $b_l$ and $\beta$ are constants, and m is a natural number.

4. The medium according to claim 3, wherein the first diffusion length is not more than 50 nm, and the second diffusion length is 50 nm (inclusive) to 200 µm (inclusive).

5. The medium according to claim 3, wherein the constants $a_k$, $b_l$, $\alpha$, and $\beta$ are set so that a value of an evaluation function including sensitivity of the light intensity distribution corrected by the correction function to the pattern of the reticle, and sensitivity of the light intensity distribution corrected by the correction function to an amount of exposure, falls within a tolerance.

6. The medium according to claim 3, wherein the constants $a_k$, $b_l$, $\alpha$, and $\beta$ are set so that a value of an evaluation function expressed as a root-mean-square value of a difference between a line width of the resist pattern calculated from the light intensity distribution corrected by the correction function, and a line width of the resist pattern obtained by exposure processing, falls within a tolerance.

7. A calculation method of calculating, using a computer, a resist pattern formed on a substrate by a resist-pattern forming method, the resist pattern being used for fabricating a device, the calculation method comprising:
   a first step of calculating a light intensity distribution of an optical image formed on the resist, based on a pattern of a reticle and an exposure condition;
   a second step of convoluting, using a first diffusion length representing diffusion in the resist, the light intensity distribution calculated in the first step;

a third step of calculating a representative light intensity for each of a plurality of points within a plane of the resist, that is representative of light intensities in a region which has a predetermined size and includes each of the plurality of points, using the light intensity distribution calculated in the first step or the light intensity distribution convoluted in the second step;

a fourth step of correcting the light intensity distribution convoluted in the second step by adding, to the light intensity distribution convoluted in the second step, a correction function including a first function given by:

$$\left\{\sum_{k=0}^{n}(a_k J^k)\right\}\exp(-\alpha J),$$

where J is the distribution of the representative light intensity, $a_k$ and $\alpha$ are constants, and n is a natural number; and a fifth step of calculating the resist pattern based on the light intensity distribution corrected in the fourth step, and a slice level set in advance, wherein the resist-pattern forming method comprises the steps of:

exposing the resist on a substrate to light via the pattern of the reticle and a projection optical system using the light intensity distribution corrected in the fourth step; and developing the exposed resist on the substrate.

* * * * *